US012614589B2

(12) United States Patent
Nakazawa et al.

(10) Patent No.: US 12,614,589 B2
(45) Date of Patent: Apr. 28, 2026

(54) CONTROL DEVICE, STORAGE DEVICE, SEMICONDUCTOR DEVICE, AND CONTROL METHOD

(71) Applicant: Sony Semiconductor Solutions Corporation, Kanagawa (JP)

(72) Inventors: Masaaki Nakazawa, Tokyo (JP); Masami Kuroda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 161 days.

(21) Appl. No.: 18/270,980

(22) PCT Filed: Dec. 17, 2021

(86) PCT No.: PCT/JP2021/046666
§ 371 (c)(1),
(2) Date: Jul. 5, 2023

(87) PCT Pub. No.: WO2022/149433
PCT Pub. Date: Jul. 14, 2022

(65) Prior Publication Data
US 2024/0071492 A1      Feb. 29, 2024

(30) Foreign Application Priority Data

Jan. 6, 2021      (JP) ................................. 2021-000716

(51) Int. Cl.
*G11C 13/00*          (2006.01)
(52) U.S. Cl.
CPC ...... *G11C 13/0069* (2013.01); *G11C 13/0061* (2013.01); *G11C 2013/0083* (2013.01)

(58) Field of Classification Search
CPC ............ G11C 13/0069; G11C 13/0061; G11C 2013/0083
See application file for complete search history.

(56) References Cited

U.S. PATENT DOCUMENTS 5,239,679 A      8/1993   Murai
8,537,594 B2     9/2013   Wada
(Continued)

FOREIGN PATENT DOCUMENTS

JP      2008-204582 A      9/2008
JP      2013-114736 A      6/2013
(Continued)

OTHER PUBLICATIONS

International Search Report issued in International Patent Application No. PCT/JP2021/046666 on Feb. 1, 2022 and English translation of same. 5 pages.
(Continued)

*Primary Examiner* — Vanthu T Nguyen
(74) *Attorney, Agent, or Firm* — K&L Gates LLP

(57)          ABSTRACT
A control device (10) according to an embodiment includes an initial write instruction unit (30) and a data write instruction unit (40). The initial write instruction unit (30), before accepting an information write request to a storage device (20) including a plurality of resistance change storage elements each of which stores information by using a difference of the resistance state, outputs to the storage device (20) a write instruction to bring the storage element into a first resistance state. The data write instruction unit (40), upon accepting a write request, outputs to the storage device (20) a write instruction to bring the storage element into the first resistance state or a second resistance state according to the write request.

14 Claims, 14 Drawing Sheets

(56)     References Cited

U.S. PATENT DOCUMENTS

| | | | | |
|---|---|---|---|---|
| 9,552,256 | B2 * | 1/2017 | Kim | G11C 29/52 |
| 11,055,021 | B2 * | 7/2021 | Wang | G11C 13/0069 |
| 2008/0209117 | A1 | 8/2008 | Kajigaya | |
| 2009/0109729 | A1 * | 4/2009 | Toda | G11C 13/0007 |
| | | | | 365/148 |
| 2013/0135949 | A1 | 5/2013 | An | |
| 2019/0035460 | A1 | 1/2019 | Terada | |
| 2019/0369920 | A1 | 12/2019 | Wang | |

FOREIGN PATENT DOCUMENTS

| | | | |
|---|---|---|---|
| JP | 5234106 | B2 | 7/2013 |
| TW | 201901666 | A | 1/2019 |
| WO | WO2017/138234 | A1 | 8/2017 |

OTHER PUBLICATIONS

Written Opinion issued in International Patent Application No. PCT/JP2021/046666 on Feb. 1, 2022. 5 pages.

* cited by examiner

FIG.1

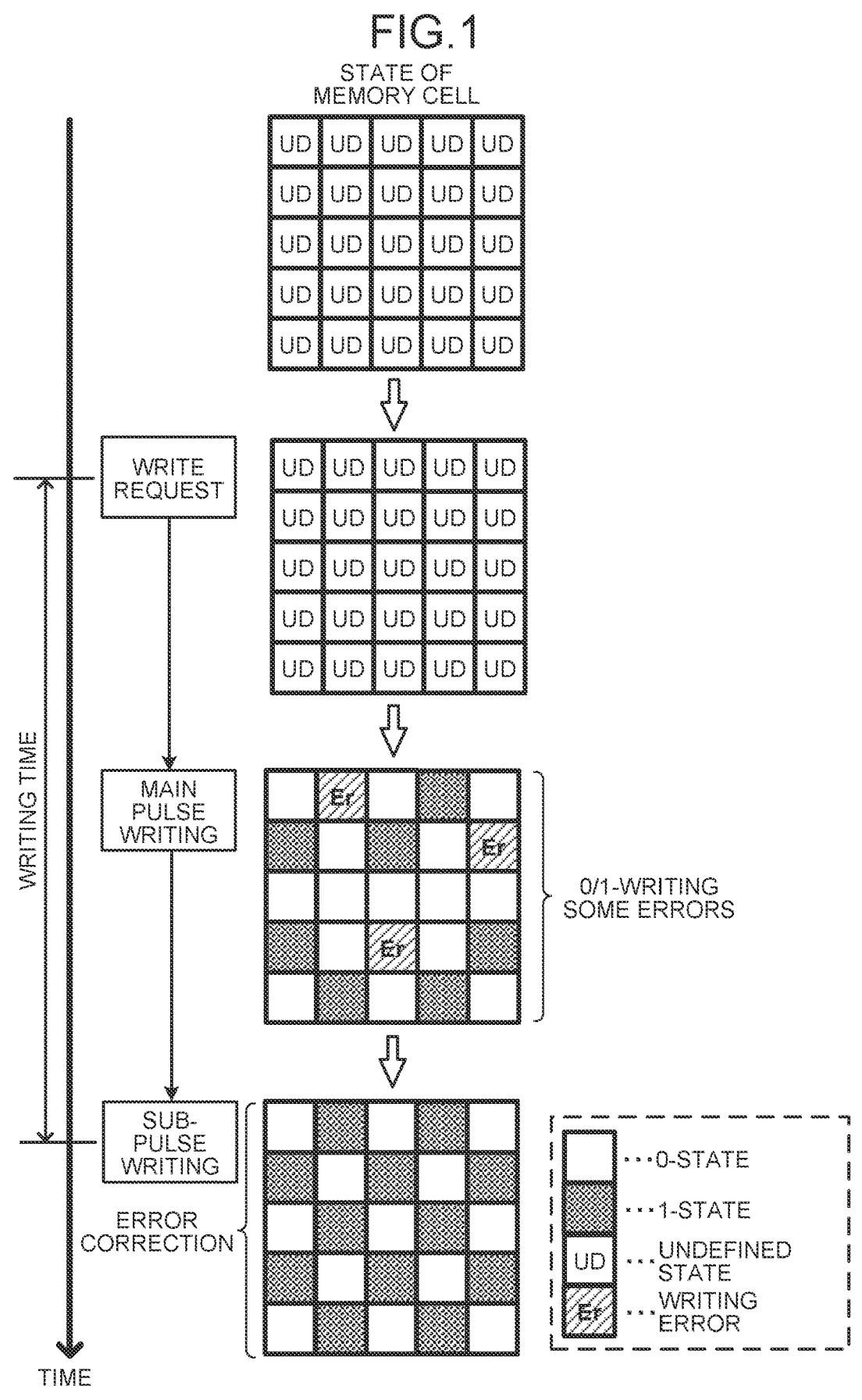

STATE OF
MEMORY CELL

WRITE
REQUEST

MAIN
PULSE
WRITING

0/1-WRITING
SOME ERRORS

SUB-
PULSE
WRITING

ERROR
CORRECTION

WRITING TIME

TIME

···0-STATE

···1-STATE

UD ···UNDEFINED
STATE

Er ···WRITING
ERROR

TIME

101

TIME

CONTROL DEVICE, STORAGE DEVICE, SEMICONDUCTOR DEVICE, AND CONTROL METHOD

FIELD

The present disclosure relates to a control device, a storage device, a semiconductor device, and a control method.

BACKGROUND

There is a resistance change storage element (MTJ, magnetic tunnel junction) that changes the resistance state by passing a current and records information by using a difference of the resistance state. When subjected to only one round of pulse application, the MTJ may have a high error rate due to factors such as variation in resistance value between storage elements and temperature drift in the holding state.

Thus, for example, in a recording method for a magnetic memory described in Patent Literature 1, first, information is written on all storage elements by means of a main pulse of a high voltage or a sufficiently long length. Subsequently, the same information as that when the main pulse is applied is written on all the storage elements by means of a sub-pulse, and errors that occurred in the writing based on the main pulse are overwritten; thereby, the error rate is reduced.

CITATION LIST

Patent Literature

Patent Literature 1: Japanese Patent No. 5234106

SUMMARY

Technical Problem

However, in the above conventional technology, since pulse application needs to be performed multiple times on the same storage element in order to write information, the reliability of written information and the speed of information writing have a trade-off relationship, and it is not possible to achieve both of them.

Thus, the present disclosure proposes a control device, a storage device, a semiconductor device, and a control method capable of improving the reliability of written information and the speed of information writing.

Solution to Problem

According to the present disclosure, a control device is provided. The control device includes an initial write instruction unit and a data write instruction unit. The initial write instruction unit, before accepting an information write request to a storage device including a plurality of resistance change storage elements each of which stores information by using a difference of the resistance state, outputs to the storage device a write instruction to bring the storage element into a first resistance state. The data write instruction unit, upon accepting a write request, outputs to the storage device a write instruction to bring the storage element into the first resistance state or a second resistance state according to the write request.

BRIEF DESCRIPTION OF DRAWINGS

FIG. 1 is an explanatory diagram of a control method according to a comparative example of the present disclosure.

DESCRIPTION OF EMBODIMENTS

Figure 2:
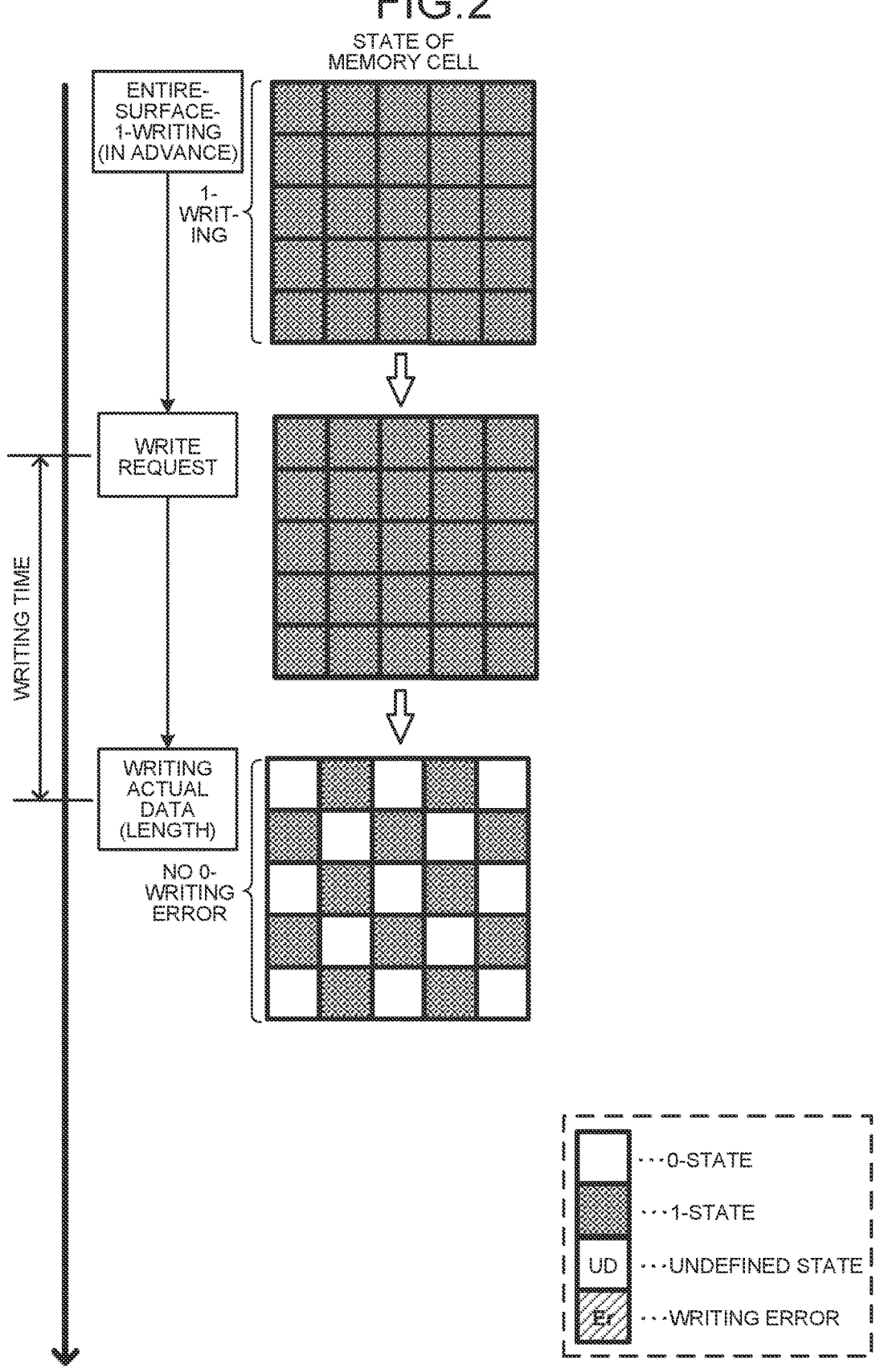
FIG. 2 is an explanatory diagram of a control method according to the present disclosure.

Hereinbelow, embodiments of the present disclosure are described in detail based on the drawings. In the following embodiments, the same parts are denoted by the same reference numerals, and a repeated description is omitted. In the following, first, a method for controlling a storage device according to a comparative example of the present disclosure is described, and then a control device, a storage device, a semiconductor device, and a control method according to the present disclosure are described.

[1. Control Method According to Comparative Example]

FIG. 1 is an explanatory diagram of a control method according to a comparative example of the present disclosure. As illustrated in FIG. 1, in the control method according to the comparative example, all the storage elements included in a memory cell are in a state where stored information is undefined.

Then, in the control method according to the comparative example, information is written on a storage device of 0/1 (0 or 1) after an information write request comes. Herein, it is assumed that, for example, when a positive-direction current is passed through the storage element, the storage element enters a first resistance state and thereby enters a state where information of 1 is written (a 1-state).

Further, it is assumed that, when a negative-direction current is passed through the storage element, the storage element enters a second resistance state and thereby enters a state where information of 0 is written (a 0-state). Herein, a case where the storage element is less likely to enter the resistance state of 1 (the 1-state) and is likely to enter the second resistance state (the 0-state) is described as an example. It is assumed that the first resistance state is a resistance state having a larger electric resistance value than the second resistance state.

In the control method according to the comparative example, information writing based on a main pulse is first performed in order to increase the reliability of written information. At this time, the storage element is likely to enter the 0-state, and is less likely to enter the 1-state. Therefore, some storage elements to be brought into the 1-state may be writing errors. Thus, in the control method according to the comparative example, after the information writing based on the main pulse, the same information as that based on the main pulse is written again on the storage device by means of a sub-pulse. Thereby, in the control method according to the comparative example, the reliability of written information is improved.

However, in the control method according to the comparative example, the speed of information writing is reduced because two rounds of pulse application are needed during the time from when an information write request is accepted to when information writing is completed. Thus, a control method according to the present disclosure performs control to improve the reliability of written information while suppressing an increase in information writing time due to multiple rounds of pulse application.

[2. Control Method According to Present Disclosure]

FIG. 2 is an explanatory diagram of a control method according to the present disclosure. As illustrated in FIG. 2, in the control method according to the present disclosure, before an information write request is accepted, all storage elements are initialized (formatted) in advance to a 1-state where information is difficult to write, that is, an error is likely to occur (entire-surface-1-writing).

At this time, in the control method according to the present disclosure, a pulse having a relatively high voltage and a long pulse width is applied to the storage element so that all the storage elements reliably enter the 1-state. Although herein all the storage elements are brought into the 1-state, this is only an example. In the control method according to the present disclosure, in the case where only some storage elements are used for information storage according to the amount of information to be written or settings, all the storage elements used for storage can exclusively be brought into the 1-state in advance.

After that, in the control method according to the present disclosure, when an information write request is accepted, a pulse is applied to each storage element to bring the storage element into the 0-state or the 1-state according to the write request. By the control method according to the present disclosure, since the number of times of pulse application after a write request is accepted is one, an increase in information writing time can be suppressed. Further, by the control method according to the present disclosure, since the storage element to be brought into the 1-state where an error is likely to occur is already brought into the 1-state before a write request is accepted, the reliability of written information can be improved.

[3. First Sequence]

Figure 3:
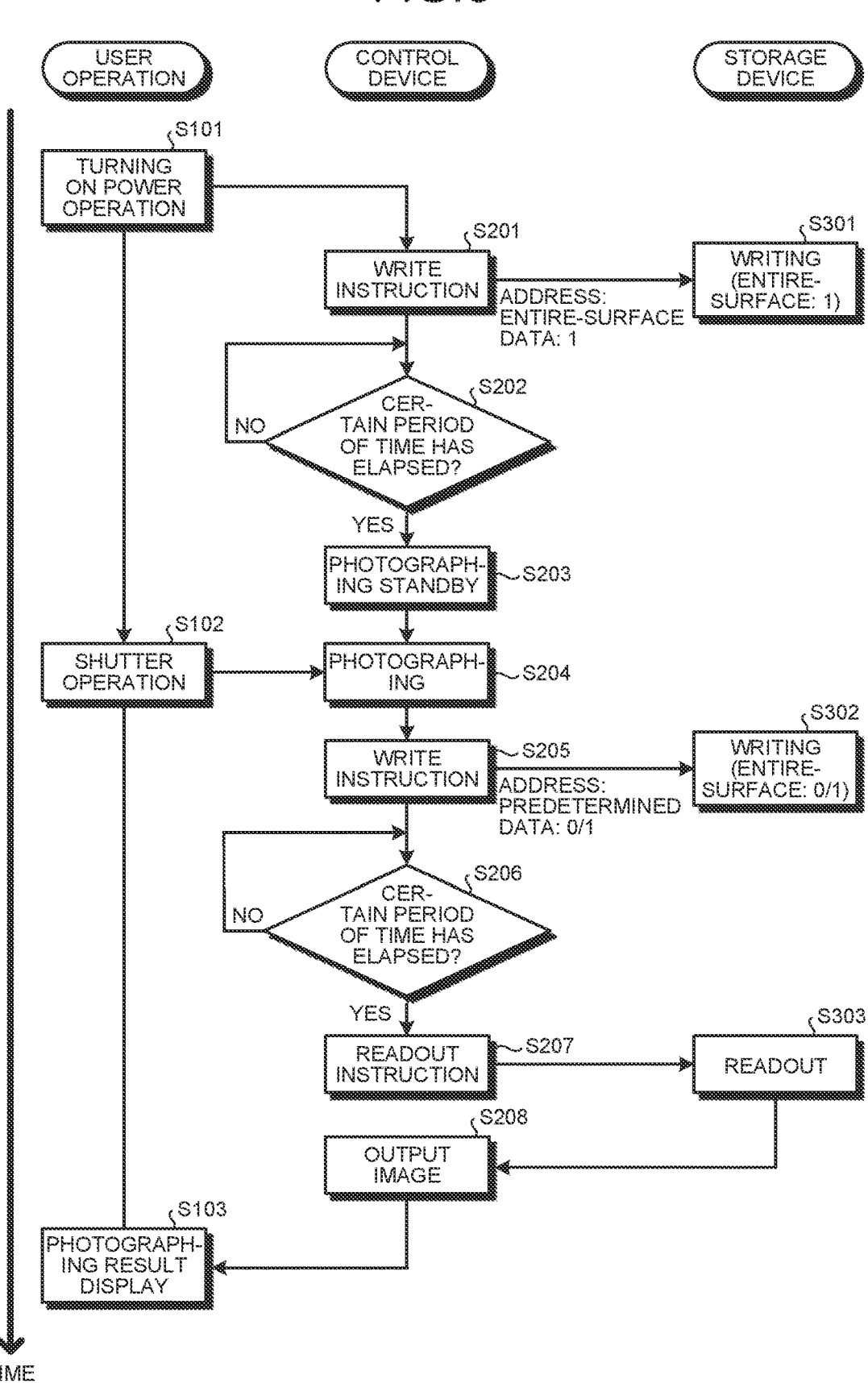
FIG. 3 is a first sequence diagram illustrating an operation of a semiconductor device according to the present disclosure.

Next, an example of processing executed in a semiconductor device according to the present disclosure is described with reference to FIG. 3. FIG. 3 is a first sequence diagram illustrating an operation of the semiconductor device according to the present disclosure. Hereinafter, operations in the case where the semiconductor device according to the present disclosure is mounted on an imaging device are described as examples; however, the semiconductor device according to the present disclosure can be employed for any electronic device that stores information.

As illustrated in FIG. 3, the semiconductor device includes a control device and a storage device. The control device controls the storage device to cause the storage device to store information of an image captured by the imaging device, for example. The storage device includes a plurality of resistance change storage elements (MTJs, magnetic tunnel junctions) each of which records information by using a difference of the resistance state. An address that can designate each storage element is allocated to the storage element in advance.

As illustrated in FIG. 3, when the power of the imaging device is turned on by a user (Step S101), a write instruction to bring the storage element into the 1-state is outputted to the storage device (Step S201). At this time, the control device outputs, to the storage device, a write instruction including the entire surface (the addresses of all the storage elements) as addresses to write information on and a command to bring the storage element corresponding to the address into the 1-state, that is, to write 1 on the storage element. Thereby, the storage device brings all the storage elements into the 1-state. That is, the storage device writes 1 on all the storage elements (Step S301).

Subsequently, the control device determines whether a certain period of time has elapsed or not (Step S202); when the control device has determined that the certain period of time has not elapsed (Step S202: No), the control device repeats the determination of Step S202 until the certain period of time elapses. Then, when the control device has determined that the certain period of time has elapsed (Step S202: Yes), the control device enters a photographing standby state (Step S203).

After that, when a shutter operation is performed on the imaging device by the user, the control device performs photographing (Step S204). At this time, a signal indicating that the shutter operation inputted to the control device has been performed corresponds to an information write request.

Thus, after photographing, the control device outputs, to the storage device, a write instruction to bring the storage element into the 1-state or a 2-state according to the write request (Step S205). At this time, the control device outputs, to the storage device, a write instruction including predetermined addresses (addresses according to the write request) as addresses to write information on and a command to bring the storage element corresponding to the address into the 1-state or the 0-state, that is, to write 1 or 0 on the storage element. Thereby, the storage device writes information of 1 or 0 according to the write request on each storage element (Step S302).

After that, the control device determines whether a certain period of time has elapsed or not (Step S206); when the control device has determined that the certain period of time has not elapsed (Step S206: No), the control device repeats the determination of Step S206 until the certain period of time elapses.

When the control device has determined that the certain period of time has elapsed (Step S206: Yes), the control device outputs an information readout instruction to the storage device (Step S207). Thereby, the storage device reads out information from each storage element (Step S303). The control device outputs an image that is information read out from the storage device (Step S208), and causes a display of the imaging device to display a photographing result, for example.

[4. First Configuration Example of Semiconductor Device]

Figure 4:
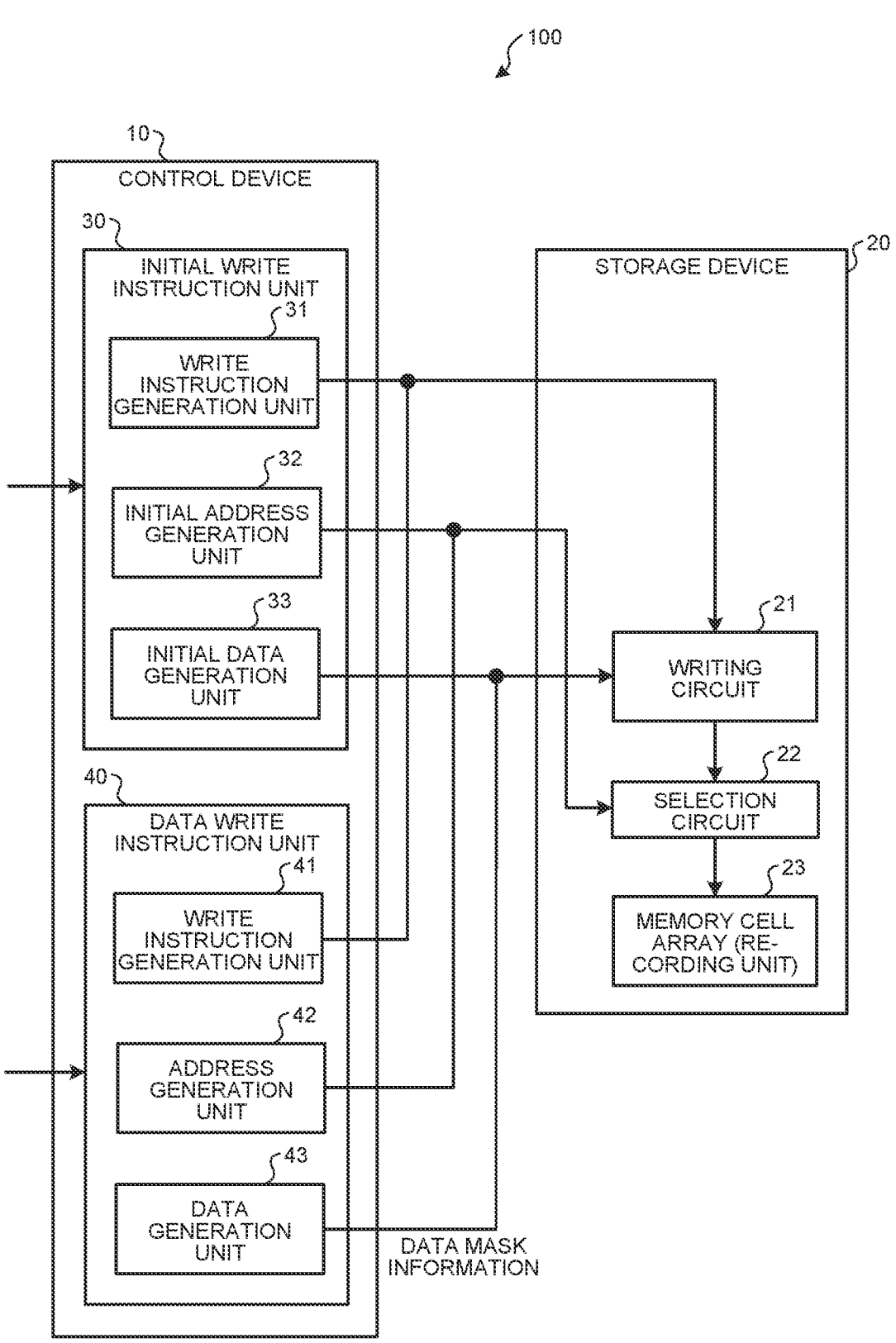
FIG. 4 is a block diagram illustrating a first configuration example of the semiconductor device according to the present disclosure.

Next, a first configuration example of a semiconductor device 100 that performs the operation illustrated in FIG. 3 is described with reference to FIG. 4. FIG. 4 is a block diagram illustrating the first configuration example of the semiconductor device according to the present disclosure.

As illustrated in FIG. 4, the semiconductor device 100 includes a control device 10 and a storage device 20. The control device 10 includes a microcomputer including a CPU (central processing unit), a ROM (read-only memory), a RAM (random access memory), etc., and various circuits. The control device 10 includes an initial write instruction unit 30 and a data write instruction unit 40 that function by the CPU executing a program stored in the ROM by using the RAM as a work area.

Part or the entirety of the initial write instruction unit 30 and the data write instruction unit 40 included in the control device may be formed of hardware such as an ASIC (application-specific integrated circuit) or an FPGA (field-programmable gate array).

The initial write instruction unit 30 and the data write instruction unit 40 included in the control device implement or execute actions of information processing described below. The internal configuration of the control device is not limited to the configuration illustrated in FIG. 4, and may be another configuration as long as it is a configuration that performs information processing described later.

The initial write instruction unit 30 includes a write instruction generation unit 31, an initial address generation unit 32, and an initial data generation unit 33. The write instruction generation unit 31, before accepting an information write request, for example when the power is turned on, outputs to the storage device 20 a write instruction including a command to start the formatting of the storage element.

The initial address generation unit 32, before accepting an information write request, for example when the power is turned on, outputs to the storage device 20 a write instruction including the address of the storage element to be formatted. For example, the initial address generation unit 32 outputs to the storage device 20 a write instruction including the addresses of all the storage elements.

The initial data generation unit 33, before accepting an information write request, for example when the power is turned on, outputs to the storage device 20 a write instruction including information to be written on the storage element to be formatted. For example, in the case where all the storage elements are easy to bring into the 0-state and difficult to bring into the 1-state, the initial data generation unit 33 outputs a write instruction including information of 1 to the storage device 20.

The storage device 20 includes a writing circuit 21, a selection circuit 22, and a memory cell array (recording unit) 23. The writing circuit 21 is a circuit that applies a pulse for writing information on the memory cell array 23. The selection circuit 22 is a circuit that selects a storage element to write information on from among a plurality of storage elements included in the memory cell array 23. The memory cell array 23 is a recording unit that includes a plurality of storages and on which information is written.

The selection circuit 22 selects a storage element of an address included in a write instruction inputted from the initial write instruction unit 30. The writing circuit 21 writes information included in a write instruction inputted from the initial write instruction unit 30 on a storage element selected by the selection circuit 22. Thereby, 1 is written on all the storage elements in the storage device 20. That is, all the storage elements enter the 1-state.

The data write instruction unit 40 includes a write instruction generation unit 41, an address generation unit 42, and a data generation unit 43. The write instruction generation unit 41, upon accepting an information write request, outputs to the storage device 20 a write instruction including a command to start the writing of information according to the write request on the storage element.

The address generation unit 42, upon accepting an information write request, outputs to the storage device 20 a write instruction including the address of a storage element on which information according to the write request is to be written.

The data generation unit 43, upon accepting an information write request, outputs to the storage device 20 a write instruction to write information of 1 or 0 that is according to the write request and that is to be written on the storage element. At this time, 1 is already written on the storage element on which 1 is to be written. Thus, the data generation unit 43 may output to the storage device 20 a write instruction including data mask information that gives a direction not to apply a pulse to the storage element on which 1 is to be written.

The selection circuit 22 selects a storage element of an address included in a write instruction inputted from the data write instruction unit 40. The writing circuit 21 writes, on the storage element selected by the selection circuit 22, information included in the write instruction inputted from the data write instruction unit 40. Thereby, information of 1 or 0 according to the write request is written on the storage device 20.

Thus, in the semiconductor device 100, information of 1 is written on the storage device 20 in advance before a write request is accepted by the control device 10. Therefore, it is sufficient that, when a write request is accepted, solely information of 0, which is easy to write, be written on the storage device 20, and thus the writing of actual data can be completed in a short time.

[5. Second Configuration Example of Semiconductor Device]

Figure 5:
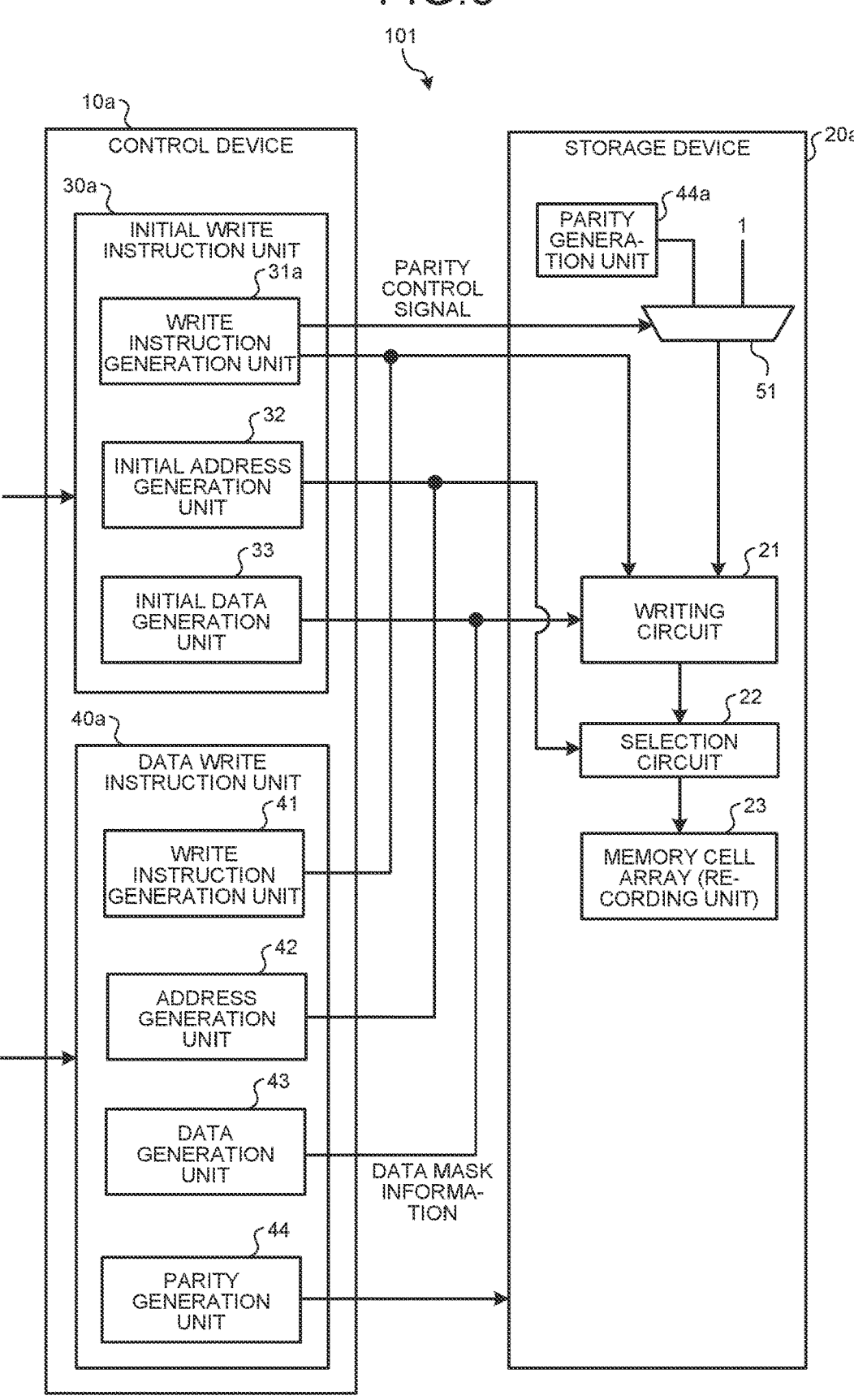
FIG. 5 is a block diagram illustrating a second configuration example of the semiconductor device according to the present disclosure.

Next, a second configuration example of a semiconductor device 101 that performs the operation illustrated in FIG. 3 is described with reference to FIG. 5. FIG. 5 is a block diagram illustrating the second configuration example of the semiconductor device according to the present disclosure.

As illustrated in FIG. 5, the semiconductor device 101 includes a control device 10a and a storage device 20a. The control device 10a includes an initial write instruction unit 30a and a data write instruction unit 40a. The initial write instruction unit 30a has a similar configuration to the initial write instruction unit 30 of the first configuration example except that a write instruction generation unit 31a outputs a write instruction including a parity control signal to the storage device 20a.

The write instruction generation unit 31a of the initial write instruction unit 30a outputs, to the storage device 20a, a write instruction including a parity control signal whereby a storage element that stores parity to be inserted into information to be written on the storage device 20a is brought into the 1-state. Before accepting an information write request, for example when the power is turned on, the write instruction generation unit 31a outputs a write instruction including a parity control signal to the storage device 20a.

The data write instruction unit 40a has a similar configuration to the data write instruction unit 40 of the first configuration example except that a parity generation unit 44 is provided. The parity generation unit 44 generates information of parity to be inserted into information to be written on the storage device 20a, and outputs the information of parity to the storage device 20a.

The storage device 20a has a similar configuration to the storage device 20 of the first configuration example except that a parity generation unit 44a and a multiplexer 51 are provided. Information of parity is inputted from the parity generation unit 44 of the data write instruction unit 40a to the parity generation unit 44a of the storage device 20a. The parity generation unit 44a outputs the inputted information of parity to the multiplexer 51. Further, information of 1 is inputted to the multiplexer 51.

The multiplexer 51 outputs either one of information of parity and information of 1 to the writing circuit 21 according to the parity control signal. In the case where a parity control signal is inputted, if the information inputted from the parity generation unit 44a is 0, the multiplexer 51 outputs information of 1, which is another input, to the writing circuit 21.

Further, in the case where a parity control signal is inputted, if the information inputted from the parity generation unit 44a is 1, the multiplexer 51 outputs the information of 1 inputted from the parity generation unit 44a to the writing circuit 21. The multiplexer 51 may constantly output information of 1 until a write request is accepted. Before a write request is accepted, the writing circuit 21 writes 1 on a storage element on which parity is to be written.

When a write request is accepted, the multiplexer 51 outputs information of 0 or 1 according to the parity to the writing circuit 21. The writing circuit 21 writes information of 0 or 1 according to the parity on the storage element.

Thus, in the semiconductor device 101, also a storage element on which parity is to be written is brought into the 1-state in advance, and then when a write request is accepted, a storage element on which parity of 0 is to be written is brought into the 0-state. Thus, in the semiconductor device 101, also a storage element that stores parity can be improved in the reliability of written parity and the speed of parity writing.

[6. Second Sequence]

Figure 6:
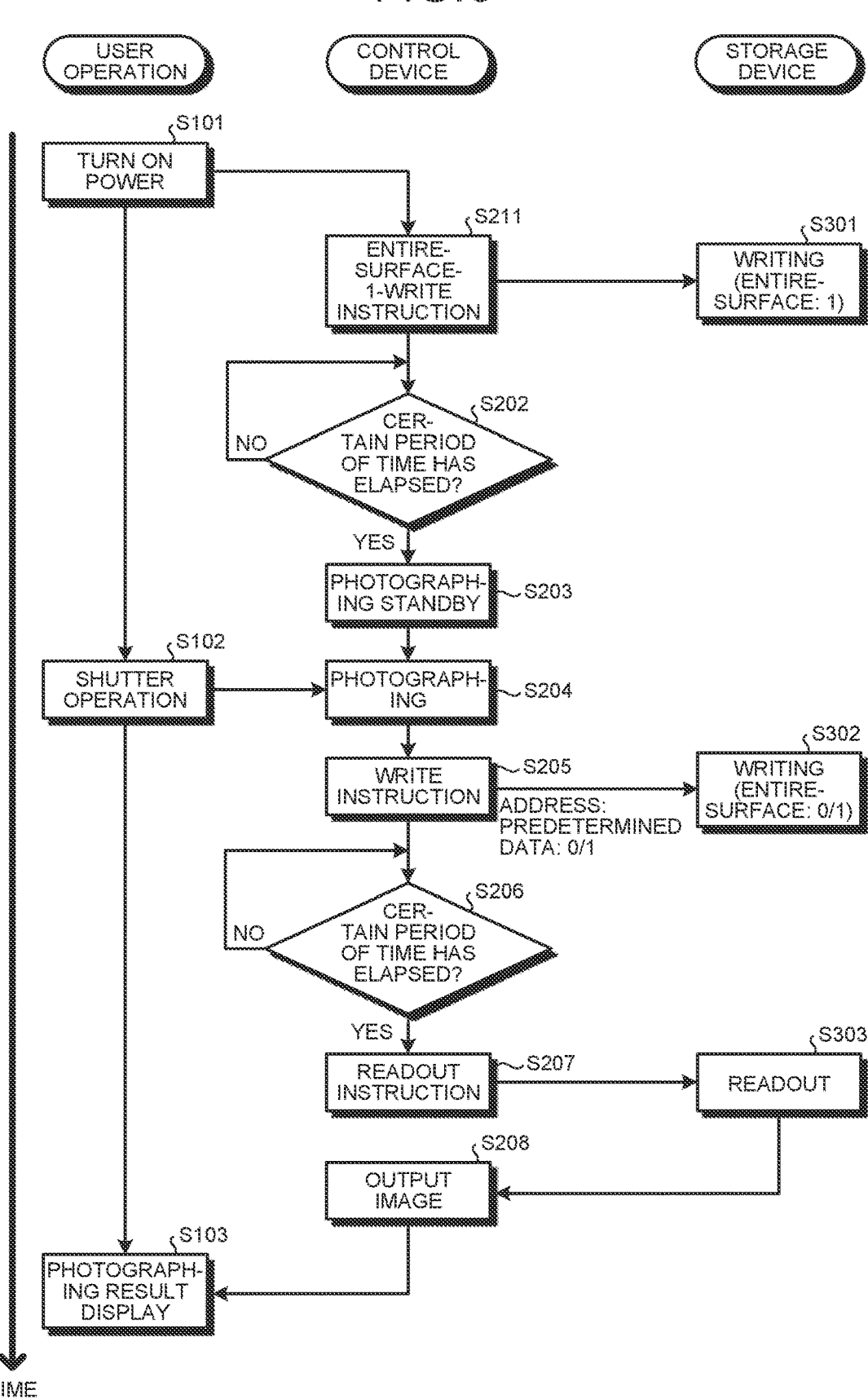
FIG. 6 is a second sequence diagram illustrating an operation of the semiconductor device according to the present disclosure.

FIG. 6 is a second sequence diagram illustrating an operation of the semiconductor device according to the present disclosure. As illustrated in FIG. 6, the second sequence is similar to the first sequence except that the processing of Step S211 is performed instead of the processing of Step S201. When the power of the imaging device is turned on by a user (Step S101), the control device outputs a front-surface-1-write instruction to the storage device (Step S211).

At this time, the control device outputs neither an address designating a storage element nor information to be stored in the storage element to the storage device, but outputs a format instruction (front-surface-1-write instruction) to the storage device. When a format instruction is inputted, the storage device writes 1 on all the storage elements (Step S301). After that, the control device and the storage device perform similar processing to the first sequence.

Thus, in the second sequence, by simply adding a function of outputting a format instruction to the existing control device, the storage device can bring all the storage elements into the 1-state in advance before an information write request is accepted.

[7. Third Configuration Example of Semiconductor Device]

Figure 7:
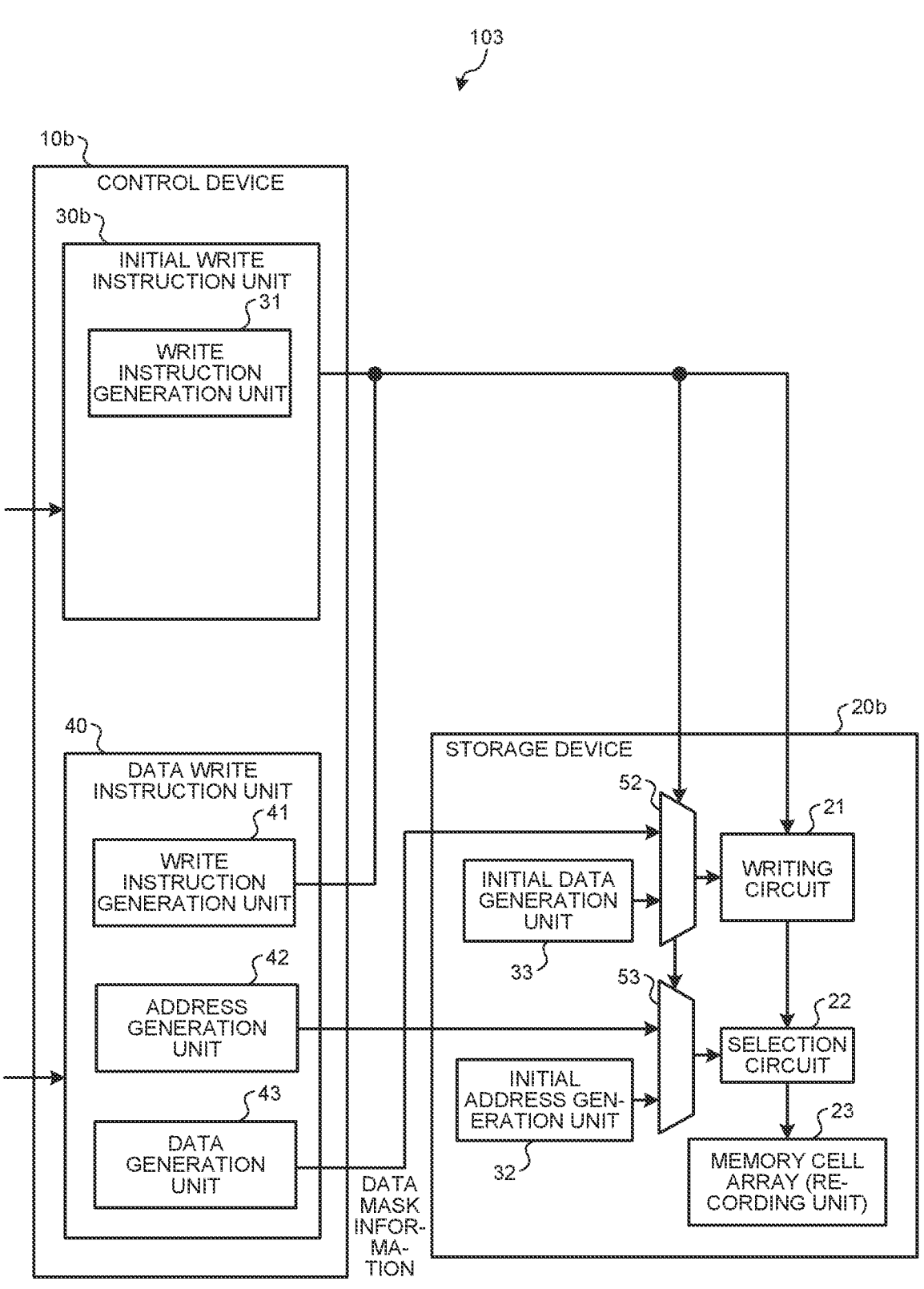
FIG. 7 is a block diagram illustrating a third configuration example of the semiconductor device according to the present disclosure.

Next, a third configuration example of a semiconductor device 103 that performs the operation illustrated in FIG. 6 is described with reference to FIG. 7. FIG. 7 is a block diagram illustrating the third configuration example of the semiconductor device according to the present disclosure.

As illustrated in FIG. 7, the semiconductor device 103 includes a control device 10b and a storage device 20b. The control device 10b includes an initial write instruction unit 30b and a data write instruction unit 40. The initial write instruction unit 30b includes a write instruction generation unit 31, but includes neither an initial data generation unit 33 nor an initial address generation unit 32.

Instead, the storage device 20b includes an initial data generation unit 33 and an initial address generation unit 32. Before accepting an information write request, for example when the power is turned on, the write instruction generation unit 31 outputs a format instruction to the storage device 20b. The data write instruction unit 40 of the control device 10b has a similar configuration to the data write instruction unit 40 of the first configuration.

As described above, the storage device 20b includes the initial data generation unit 33 and the initial address generation unit 32. Further, the storage device 20b includes multiplexers 52 and 53. The writing circuit 21, the selection circuit 22, and the memory cell array 23 have similar configurations to those of the first configuration.

A format instruction is inputted to each of the multiplexers 52 and 53 as a control signal from a write instruction generation unit 31 of the initial write instruction unit 30b. The format instruction is inputted also to the writing circuit 21.

Further, information to be written on the storage element is inputted to the multiplexer 52 from the initial data generation unit 33 and the data generation unit 43. The initial data generation unit 33 outputs information of 1. The data generation unit 43 outputs information of 1 or 0 according to the write request.

When a format instruction is inputted, the multiplexer 52 outputs information inputted from the initial data generation unit 33 to the writing circuit 21. When a format instruction is not inputted, the multiplexer 52 outputs information inputted from the data generation unit 43 to the writing circuit 21.

Further, the address of a storage element to write information on is inputted to the multiplexer 53 from the initial address generation unit 32 and the address generation unit 42. The initial address generation unit 32 outputs the addresses of all the storage elements. The address generation unit 42 outputs an address according to the write request.

When a format instruction is inputted, the multiplexer 53 outputs an address inputted from the initial address generation unit 32 to the selection circuit 22. When a format instruction is not inputted, the multiplexer 53 outputs an address inputted from the address generation unit 42 to the selection circuit 22.

Thereby, when a format instruction is inputted, the writing circuit 21 can perform formatting while setting all the storage elements to the 1-state. Further, when a format instruction is not inputted, that is, when a write request is accepted, the writing circuit 21 can write information according to the write request.

[8. Third Sequence]

Figure 8:
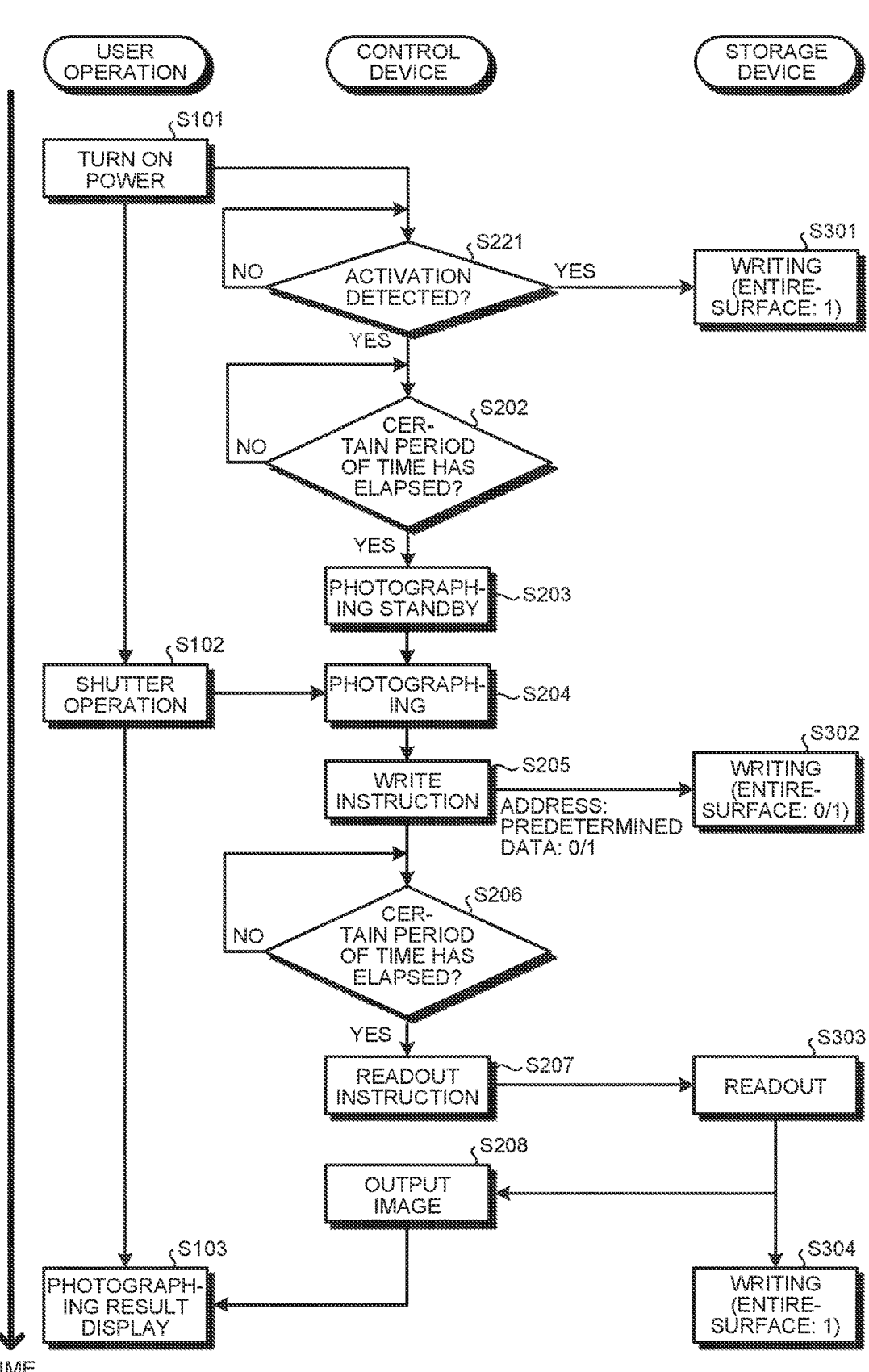
FIG. 8 is a third sequence diagram illustrating an operation of the semiconductor device according to the present disclosure.

FIG. 8 is a third sequence diagram illustrating an operation of the semiconductor device according to the present disclosure. As illustrated in FIG. 8, the second sequence is similar to the first sequence except that the processing of Step S221 and the processing of Step S304 are added instead of the processing of Step S201. When the power of the imaging device is turned on by a user (Step S101), the control device detects activation (Step S221: Yes), and moves the processing to Steps S301 and S202. When the control device does not detect activation (Step S221: No), the control device repeats the determination of Step S221 until it detects activation.

The control device performs similar processing to the first sequence. The storage device performs the processing of Steps S301, S302, and S303 similar to the first sequence, and then performs writing (the entire surface: 1) (Step S304).

Thus, upon detecting the activation of the control device, the writing circuit of the storage device formats all the storage elements into the 1-state. Thereby, the storage device can bring the storage element into a first state in advance before the existing control device accepts an information write request.

Further, when information is read out from all the storage elements, the control device formats all the storage elements into the 1-state. Thereby, the storage device can bring the storage element into the 1-state every time during the time from when information is read out to when the next piece of information is written.

[9. Fourth Configuration Example of Semiconductor Device]

Figure 9:
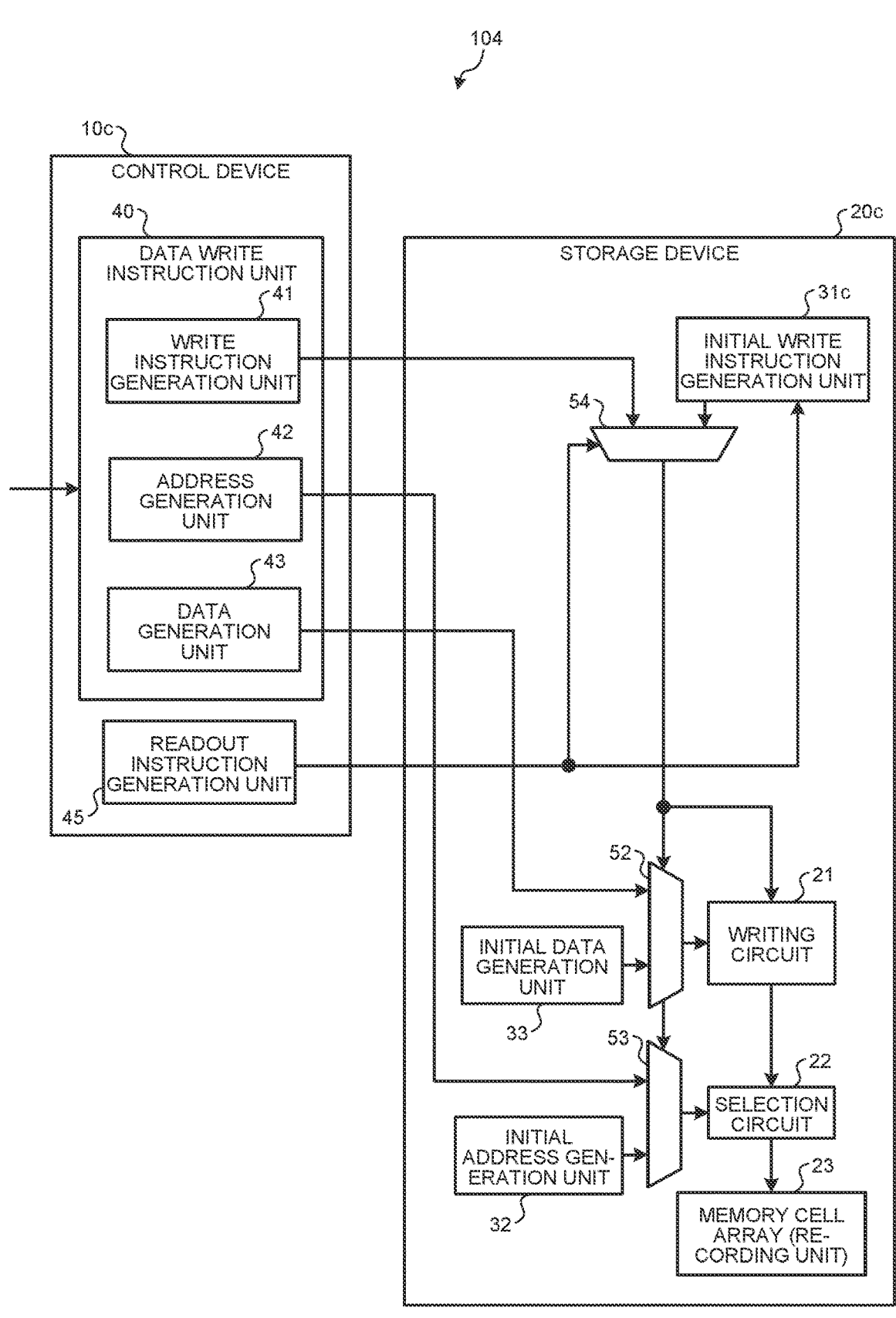
FIG. 9 is a block diagram illustrating a fourth configuration example of the semiconductor device according to the present disclosure.

Next, a fourth configuration example of a semiconductor device 104 that performs the operation illustrated in FIG. 6 is described with reference to FIG. 9. FIG. 9 is a block diagram illustrating the fourth configuration example of the semiconductor device according to the present disclosure.

As illustrated in FIG. 9, the semiconductor device 104 includes a control device 10c and a storage device 20c. The control device 10c includes a data write instruction unit 40, but does not include an initial write instruction unit 30. The control device 10c further includes a readout instruction generation unit 45.

The storage device 20c includes an initial write instruction generation unit 31c and a multiplexer 54 in addition to the configuration included in the storage device 20b of the third configuration example. Commands are inputted to the multiplexer 54 from the initial write instruction generation unit 31c and the write instruction generation unit 41.

When the power of the control device 10c is turned on, the initial write instruction generation unit 31c outputs to the multiplexer 54 a write instruction including a command to start the formatting of the storage element. Upon accepting an information write request, the write instruction generation unit 41 outputs to the multiplexer 54 a write instruction including a command to start the writing of information according to the write request on the storage element.

When reading out information from the storage element, the readout instruction generation unit 45 outputs a readout instruction to the initial write instruction generation unit 31c. When a readout instruction is inputted, the initial write instruction generation unit 31c, after information is read out from the storage element, outputs to the multiplexer 54 a write instruction including a command to start the formatting of the storage element. Further, the readout instruction generation unit 45 outputs a readout instruction to the multiplexer 54 as a control signal.

The multiplexer 54 outputs, to each of the multiplexers 52 and 53, a command inputted from the initial write instruction generation unit 31c both when turning-on of the power of the control device 10c is detected and when a readout instruction is inputted as a control signal. The multiplexer 54 outputs, to each of the multiplexers 52 and 53, a command from the write instruction generation unit 41 when the command is inputted from the write instruction generation unit 41.

Thereby, the writing circuit 21 formats all the storage elements into the 1-state both when turning-on of the power of the control device 10c is detected and when information is read out from the storage device 20c. That is, the writing circuit 21 writes information of 1 on all the storage elements.

When a write request is accepted, the writing circuit 21 brings the storage element into the 1-state or the 2-state according to the write request. That is, the writing circuit 21 writes information of 1 or 0 on the storage element according to the write request.

The storage device 20c may include an internal timer. In this case, when a predetermined period of time is measured by the internal timer, the writing circuit 21 brings the storage element into the 1-state. Thereby, the storage device 20c can independently set the storage element to the 1-state without being affected by the operation of the control device 10c.

[10. Fourth Sequence]

Figure 10:
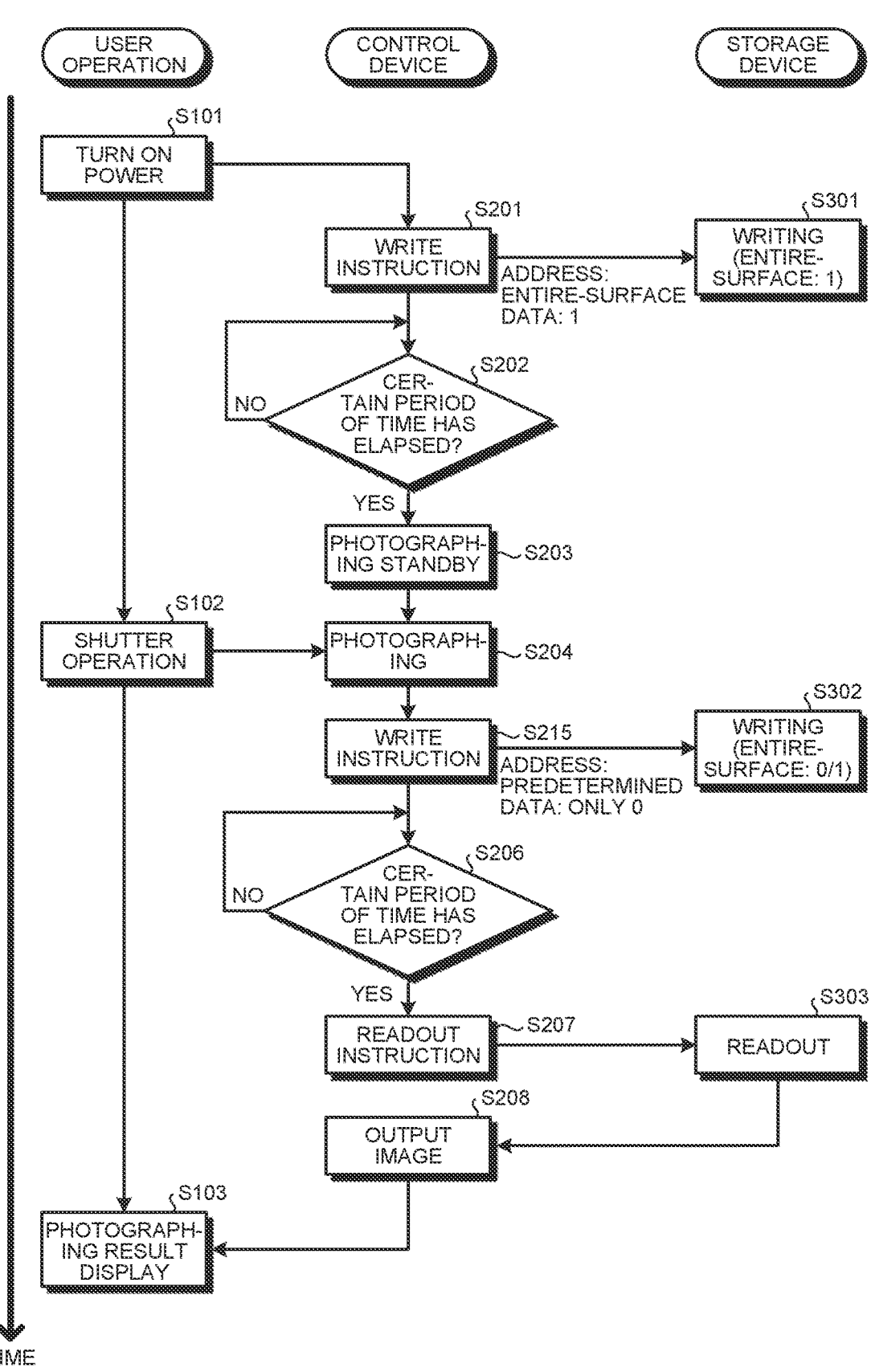
FIG. 10 is a fourth sequence diagram illustrating an operation of the semiconductor device according to the present disclosure.

FIG. 10 is a fourth sequence diagram illustrating an operation of the semiconductor device according to the present disclosure. As illustrated in FIG. 10, the fourth sequence is similar to the first sequence except that the processing of Step S215 is performed instead of the processing of Step S205.

In Step S215, the control device outputs, to the storage device, a write instruction to write information according to the write request on the storage element. At this time, in the storage device, information of 1 is already written on all the storage elements by virtue of Step S301.

Thus, in Step S215, the control device outputs a write instruction solely to a storage element on which, among the pieces of information according to the write request, information of 0 is to be written, and does not output a write instruction to a storage element on which information of 1 is to be written. Thereby, the storage device does not need to write information of 0 in the processing of Step S302, and therefore power consumption can be reduced.

[11. Fifth Sequence]

Figure 11:
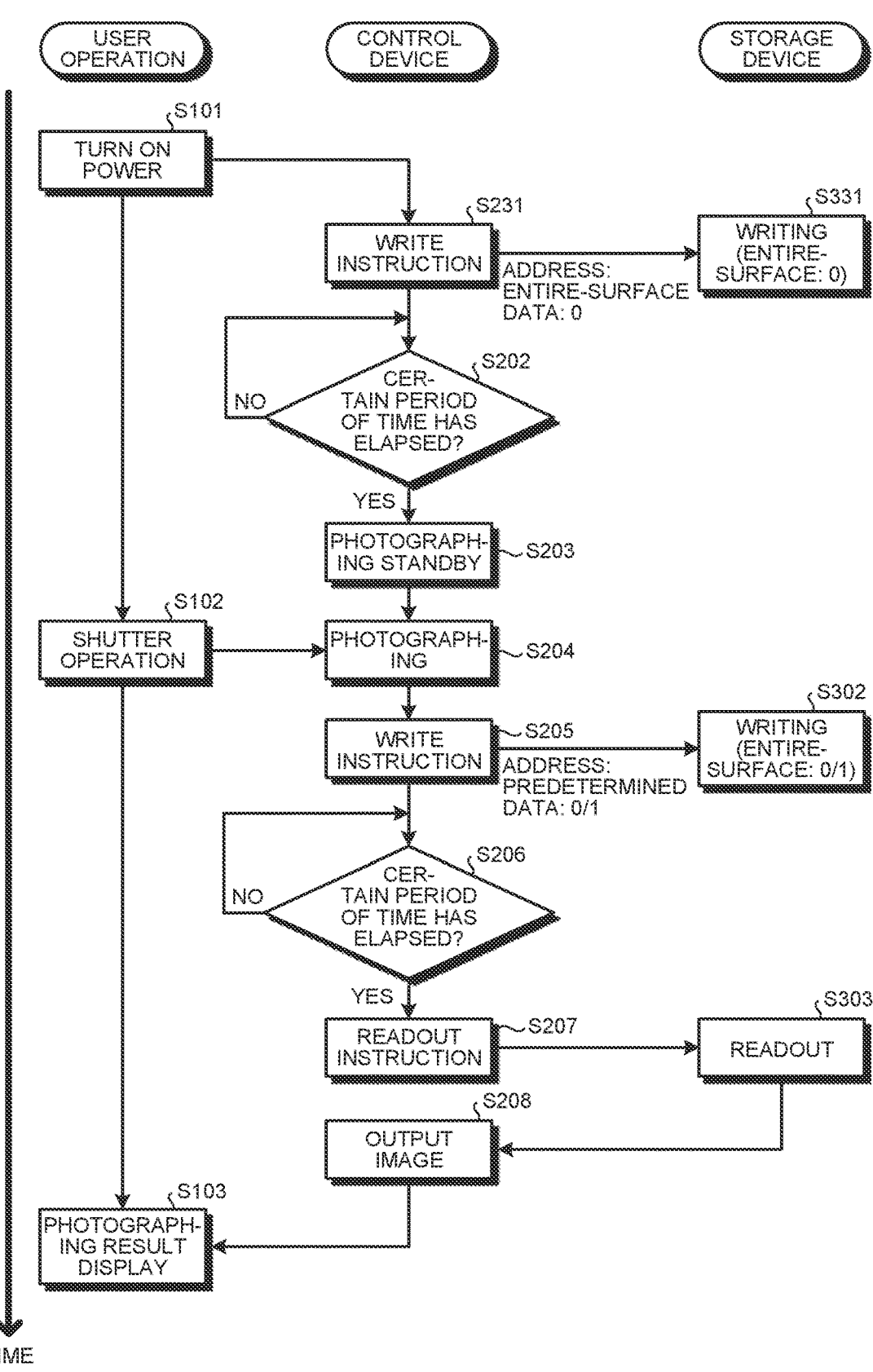
FIG. 11 is a fifth sequence diagram illustrating on operation of the semiconductor device according to the present disclosure.

FIG. 11 is a fifth sequence diagram illustrating an operation of the semiconductor device according to the present disclosure. As illustrated in FIG. 11, the fifth sequence is similar to the first sequence except that the processing of Step S231 is performed instead of the processing of Step S201 and the processing of Step S331 is performed instead of the processing of Step S301.

In Step S231, the storage device outputs, to the storage device, a write instruction to write information of 0 on all the storage elements. Thereby, in Step S331, the storage device writes information of 0 on all the storage elements.

Thereby, for example, in the case where all the storage elements are likely to enter the 1-state and all the storage elements are less likely to enter the 0-state, all the storage elements can be formatted into the 0-state before an information write request is accepted. Thereby, the reliability of written information and the speed of information writing can be improved.

[12. Arrangement Examples]

Figure 12:
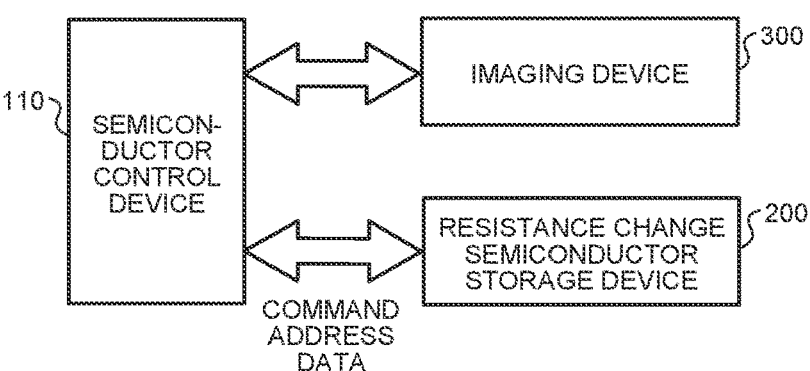
FIG. 12 is a block diagram illustrating a first arrangement example of a semiconductor control device and a resistance change semiconductor storage device according to the present disclosure.
Figure 13:
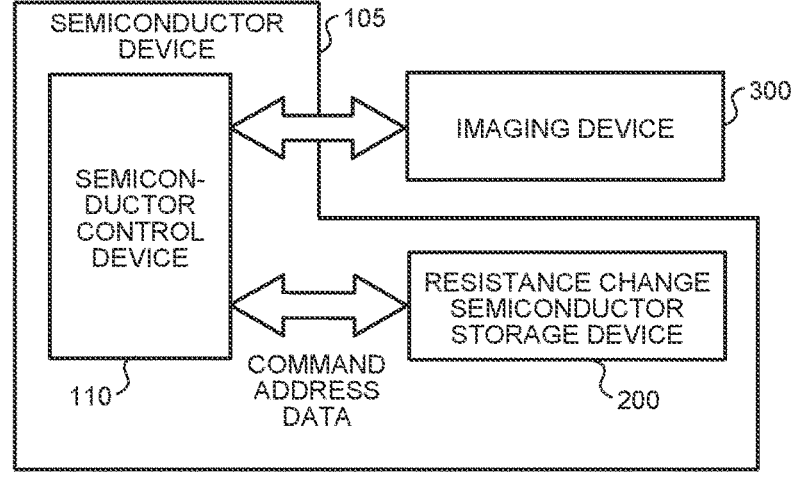
FIG. 13 is a block diagram illustrating a second arrangement example of the semiconductor control device and the resistance change semiconductor storage device according to the present disclosure.
Figure 14:
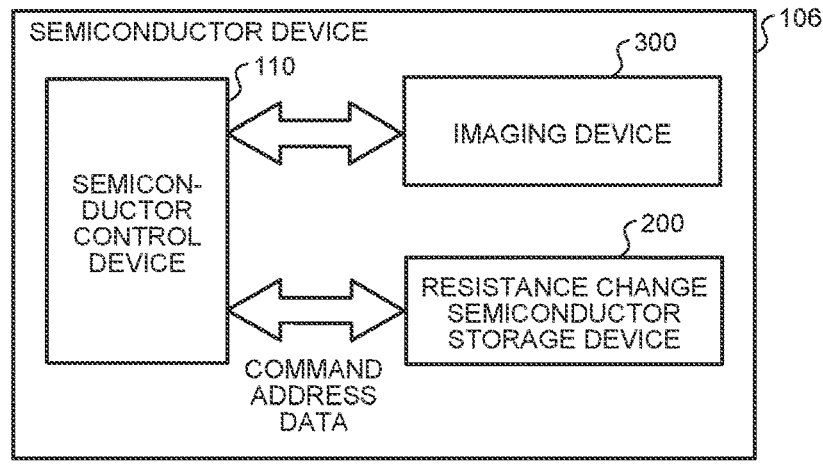
FIG. 14 is a block diagram illustrating a third arrangement example of the semiconductor control device and the resistance change semiconductor storage device according to the present disclosure.

Next, a first to a third arrangement example of a semiconductor control device and a resistance change semiconductor storage device according to the present disclosure are described with reference to FIGS. 12 to 14. FIGS. 12 to 14 are block diagrams illustrating the first to third arrangement examples of the semiconductor control device and the resistance change semiconductor storage device according to the present disclosure.

Herein, arrangements of a resistance change semiconductor storage device 200 that stores data of an image captured by an imaging device 300, a semiconductor control device 110, and the imaging device 300 are described. The semiconductor control device 110 includes any one of the control devices 10, 10a, 10b, and 10c described above. The resistance change semiconductor storage device 200 includes any one of the storage devices 20, 20a, 20b, and 20c corresponding to the control devices 10, 10a, 10b, and 10c described above.

As in the first arrangement example illustrated in FIG. 12, the semiconductor control device 110, the resistance change semiconductor storage device 200, and the imaging device 300 may be individually arranged. Further, as in the second arrangement example illustrated in FIG. 13, the semiconductor control device 110 and the resistance change semiconductor storage device 200 may be configured as one semiconductor device 105, and may be arranged separately from the imaging device 300. Further, as in the third arrangement example illustrated in FIG. 14, the semiconductor control device 110, the resistance change semiconductor storage device 200, and the imaging device 300 may be configured as one semiconductor device 106.

[13. Storage System]

Figure 15:
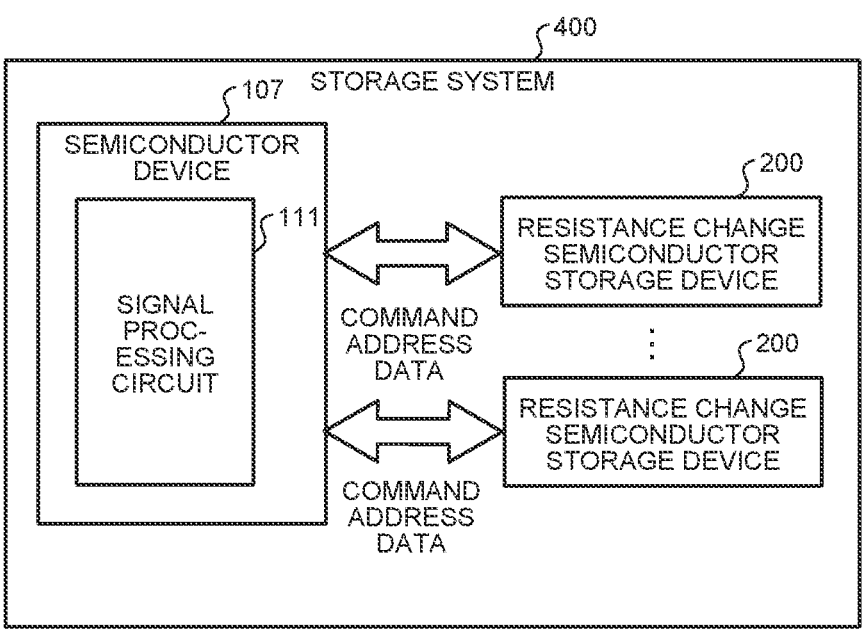
FIG. 15 is a block diagram illustrating a first configuration example of a storage system according to the present disclosure.
Figure 16:
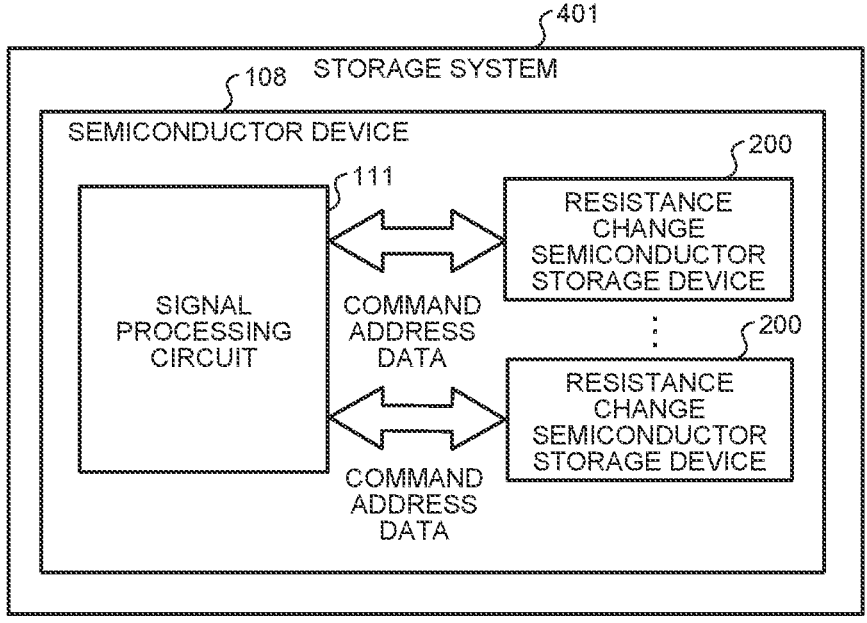
FIG. 16 is a block diagram illustrating a second configuration example of the storage system according to the present disclosure.

Next, configuration examples of a storage system according to the present disclosure are described with reference to FIGS. 15 and 16. FIGS. 15 and 16 are block diagrams illustrating a first and a second configuration example of the storage system according to the present disclosure.

A signal processing circuit 111 illustrated in FIGS. 15 and 16 includes any one of the control devices 10, 10a, 10b, and 10c described above. A resistance change semiconductor storage device 200 illustrated in FIGS. 15 and 16 includes any one of the storage devices 20, 20a, 20b, and 20c corresponding to the control devices 10, 10a, 10b, and 10c described above.

As in the first configuration example illustrated in FIG. 15, a storage system 400 according to the present disclosure may include the signal processing circuit 111 provided in a semiconductor device 107 and a plurality of resistance change semiconductor storage devices 200 provided separately from the semiconductor device 107. Further, as in the second configuration example illustrated in FIG. 16, a storage system 401 according to the present disclosure may include one semiconductor device 108 including the signal processing circuit 111 and a plurality of resistance change semiconductor storage devices 200.

[14. Electronic Device]

Figure 17:
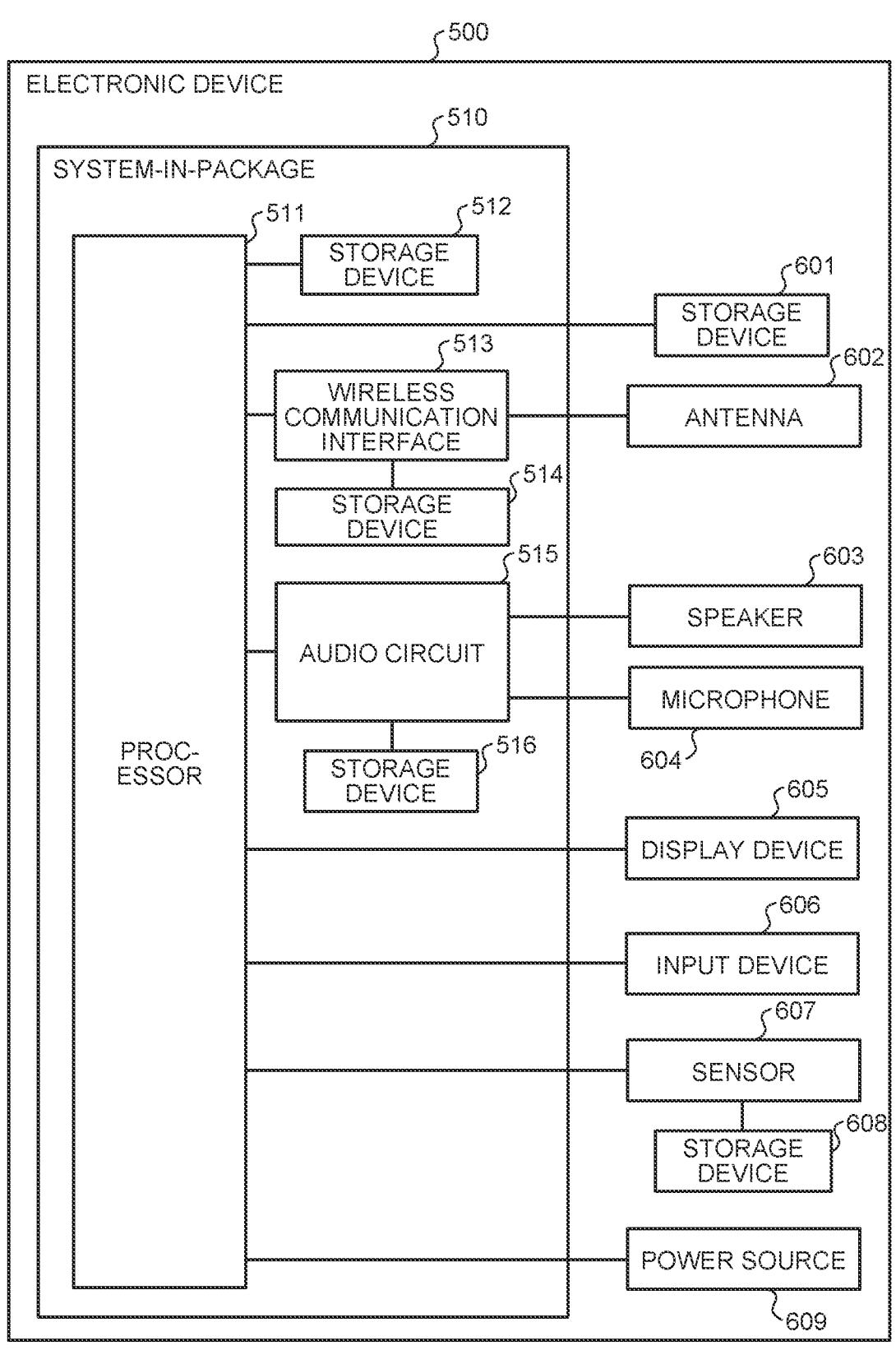
FIG. 17 is a block diagram illustrating a configuration example of an electronic device according to the present disclosure.

Next, an electronic device on which the control device 10, 10a, 10b, or 10c according to the present disclosure is mounted is described with reference to FIG. 17. FIG. 17 is a block diagram illustrating a configuration example of the electronic device according to the present disclosure.

As illustrated in FIG. 17, an electronic device 500 is, for example, a multifunctional communication device such as a smartphone, and includes a system-in-package 510, a storage device 601, an antenna 602, a speaker 603, a microphone 604, a display device 605, an input device 606, a sensor 607, a storage device 608, and a power source 609.

The system-in-package 510 includes a processor 511, a storage device 512, a wireless communication interface 513, a storage device 514, an audio circuit 515, and a storage device 516. In the case of such an electronic device, the control device 10, 10a, 10b, or 10c described above is mounted on, for example, a device to which the storage device 512, 514, 516, 601, or 608 is connected, such as the processor 511, the wireless communication interface 513, the audio circuit 515, or the sensor 607. In this case, the storage device 20, 20a, 20b, or 20c corresponding to the control device 10, 10a, 10b, or 10c is mounted as the storage device 512, 514, 516, 601, or 608.

The memory cell array 23 may include a first storage element that enters a 1-state in response to a write instruction to bring the object into the 1-state and a second storage element that enters a 2-state in response to a write instruction to bring the object into the 1-state. In this case, the storage device 20 includes a logical-physical converter that, when a write instruction is inputted from the initial write instruction unit, brings the second storage element into the 1-state. Thereby, even when the storage device 20 includes a storage element that inverts and stores information according to the write request, the storage device 20 can bring the storage element into the 1-state before an information write request is accepted by the control device 10.

As described above, in the present disclosure, the resistance change memory is initialized in advance with data in a direction in which writing is difficult, and is controlled to write actual data in response to a write instruction; thereby, the writing of actual data in response to a write instruction can be performed at high speed, and both an increase in the speed of writing and high reliability of written data, which have been difficult to balance well by a conventional control method, can be achieved.

Further, at the time of executing formatting in advance, the writing current can be suppressed because there is no need to perform writing at high speed, and at the time of writing actual data, a large current is not needed even for short pulses because writing is easy; thus, the peak current at the time of writing can be reduced.

[15. Effects]

A control device according to the embodiment includes an initial write instruction unit and a data write instruction unit. Before accepting an information write request to a storage device including a plurality of resistance change storage elements each of which stores information by using a difference of the resistance state, the initial write instruction unit outputs to the storage device a write instruction to bring the storage element into a first resistance state. Upon accepting a write request, the data write instruction unit outputs to the storage device a write instruction to bring the storage element into the first resistance state or a second resistance state according to the write request. Thereby, for example, in the case where the storage element has characteristics of being less likely to enter the first resistance state and likely to enter the second resistance state, the storage device can bring the storage element into the first resistance state before an information write request is accepted. After that, when an information write request is accepted, the storage device brings a storage element to be brought into the second resistance state into the second resistance state according to the write request. Thus, the storage device is improved in the speed of information writing because, after accepting a write request, information writing is completed by one round of pulse application. Further, the storage device can improve the reliability of written information by bringing a storage element that is less likely to enter the first resistance state into a first storage state in advance.

The initial write instruction unit outputs, to the storage device, a write instruction including an address of a storage element designating a storage element to be brought into the first resistance state and a command to bring the storage element corresponding to the address into the first resistance state. Thereby, the control device can bring the storage element included in the existing storage device into the first resistance state before accepting an information write request.

Before accepting an information write request, the initial write instruction unit designates all the storage elements as storage elements to be brought into the first resistance state. Thereby, the control device can format all the storage elements into the first state.

The data write instruction unit outputs, to the storage device, a write instruction including an address of a storage element designating a storage element to be brought into the first resistance state, a command to bring the storage element corresponding to the address into the first resistance state, an address of a storage element designating a storage element to be brought into the second resistance state, and a command to bring the storage element corresponding to the address into the second resistance state. Thereby, for the storage element to be brought into the first resistance state, the control device can reliably bring the storage element into the first state by outputting a write instruction twice before and after accepting a write request. Thereby, the storage device can further improve the reliability of written information.

The data write instruction unit outputs, to the storage device, a write instruction including an address of a storage element designating a storage element to be brought into the second resistance state and a command to bring the storage element corresponding to the address into the second resistance state. Thus, the control device, after accepting an information write request, needs only to output a write instruction solely to the storage element to be brought into the second resistance state, and therefore can improve the speed of information writing. Further, after an information write request is accepted, it is sufficient that information be written solely on the storage element to be brought into the second resistance state, and therefore the power required for information writing can be reduced.

The initial write instruction unit outputs, to the storage device, a write instruction including a parity control signal whereby a storage element that stores parity to be inserted into information to be written on the storage device is brought into the first resistance state. Thereby, also for the storage element that stores parity, the control device can improve the reliability of written parity and the speed of parity writing.

A storage device according to the present disclosure includes a plurality of resistance change storage elements and a writing circuit. Each of the plurality of resistance change storage elements stores information by using a difference of the resistance state. The writing circuit, before an information write request is accepted by a control device, brings the storage element into a first resistance state, and when an information write instruction is inputted from the control device that has accepted an information write request, brings the storage element into the first resistance state or a second resistance state according to the write request. Thereby, for example, in the case where the storage element has characteristics of being less likely to enter the first resistance state and likely to enter the second resistance state, the storage device can bring the storage element into the first resistance state before an information write request is accepted. After that, when an information write request is accepted, the storage device brings a storage element to be brought into the second resistance state into the second resistance state according to the write request. Thus, the storage device is improved in the speed of information writing because, after accepting a write request, information writing is completed by one round of pulse application. Further, the storage device can improve the reliability of written information by bringing a storage element that is less likely to enter the first resistance state into a first storage state in advance.

when a format instruction is inputted from the control device, the writing circuit brings the storage element into the first resistance state. Thus, by simply adding a function of outputting a format instruction to the existing control device, the storage device can bring the storage element into the first state in advance before an information write request is accepted.

Upon detecting the activation of the control device, the writing circuit brings the storage element into the first resistance state. Thereby, the storage device can bring the storage element into a first state in advance before the existing control device accepts an information write request.

When information is read out from the storage element, the writing circuit brings the storage element into the first resistance state. Thereby, the storage device can bring the storage element into the first state every time during the time from when information is read out to when the next piece of information is written.

The storage device includes an internal timer. when a predetermined period of time is measured by the internal timer, the writing circuit brings the storage element into the first resistance state. Thereby, the storage device can independently set the storage element to the first state without being affected by the operation of the control device.

A semiconductor device according to the present disclosure includes a storage device and a control device. The storage device includes a plurality of resistance change storage elements. Each of the plurality of resistance change storage elements stores information by using a difference of the resistance state. The control device includes an initial write instruction unit and a data write instruction unit. Before accepting an information write request to the storage device, the initial write instruction unit outputs to the storage device a write instruction to bring the storage element into a first resistance state. Upon accepting a write request, the data write instruction unit outputs to the storage device a write instruction to bring the storage element into the first resistance state or a second resistance state according to the write request. Thereby, for example, in the case where the storage element has characteristics of being less likely to enter the first resistance state and likely to enter the second resistance state, the storage device can bring the storage element into the first resistance state before an information write request is accepted. After that, when an information write request is accepted, the storage device brings a storage element to be brought into the second resistance state into the second resistance state according to the write request. Thus, the storage device is improved in the speed of information writing because, after accepting a write request, information writing is completed by one round of pulse application. Further, the storage device can improve the reliability of written information by bringing a storage element that is less likely to enter the first resistance state into a first storage state in advance.

The storage device includes a first storage element, a second storage element, and a logical-physical converter. The first storage element enters the first resistance state in response to a write instruction to bring the object into the first resistance state. The second storage element enters the second resistance state in response to a write instruction to bring the object into the first resistance state. The logical-physical converter, when a write instruction is inputted from the initial write instruction unit, brings the second storage element into the first resistance state. Thereby, even when the storage device includes a storage element that inverts and stores information according to the write request, the storage device can bring the storage element into the first state before an information write request is accepted by the control device.

A control method, by a control device, according to the present disclosure includes: before accepting an information write request to a storage device including a plurality of resistance change storage elements each of which stores information by using a difference of the resistance state, outputting to the storage device a write instruction to bring the storage element into a first resistance state; and upon accepting a write request, outputting to the storage device a write instruction to bring the storage element into the first resistance state or a second resistance state according to the write request. Thereby, for example, in the case where the storage element has characteristics of being less likely to enter the first resistance state and likely to enter the second resistance state, the storage device can bring the storage element into the first resistance state before an information write request is accepted. After that, when an information write request is accepted, the storage device brings a storage element to be brought into the second resistance state into the second resistance state according to the write request. Thus, the storage device is improved in the speed of information writing because, after accepting a write request, information writing is completed by one round of pulse application. Further, the storage device can improve the reliability of written information by bringing a storage element that is less likely to enter the first resistance state into a first storage state in advance.

The effects described in the present specification are merely examples and are not limitative ones, and there may be other effects.

The present technology can also take configurations like below.

(1)

A control device including:

an initial write instruction unit that, before accepting an information write request to a storage device including a plurality of resistance change storage elements each of which stores information by using a difference of a resistance state, outputs to the storage device a write instruction to bring the storage element into a first resistance state; and a data write instruction unit that, upon accepting the write request, outputs to the storage device a write instruction to bring the storage element into the first resistance state or a second resistance state according to the write request.

(2)

The control device according to (1), wherein the initial write instruction unit outputs, to the storage device, the write instruction including an address of the storage element designating the storage element to be brought into the first resistance state and a command to bring the storage element corresponding to the address into the first resistance state.

(3)

The control device according to (2), wherein the initial write instruction unit designates all the storage elements as the storage elements to be brought into the first resistance state.

(4)

The control device according to any one of (1) to (3), wherein the data write instruction unit outputs, to the storage device, the write instruction including an address of the storage element designating the storage element to be brought into the first resistance state, a command to bring the storage element corresponding to the address into the first resistance state, an address of the storage element designating the storage element to be brought into the second resistance state, and a command to bring the storage element corresponding to the address into the second resistance state.

(5)

The control device according to one of (1) to (3), wherein the data write instruction unit outputs, to the storage device, the write instruction including an address of the storage element designating the storage element to be brought into the second resistance state and a command to bring the storage element corresponding to the address into the second resistance state.

(6)

The control device according to one of (1) to (5, wherein the initial write instruction unit outputs, to the storage device, the write instruction including a parity control signal whereby the storage element that stores parity to be inserted into information to be written on the storage device is brought into the first resistance state.

(7)

A storage device including:

a plurality of resistance change storage elements each of which stores information by using a difference of a resistance state; and a writing circuit that, before an information write request is accepted by a control device, brings the storage element into a first resistance state, and when an information write instruction is inputted from the control device that has accepted the information write request, brings the storage element into the first resistance state or a second resistance state according to the write request.

(8)

The storage device according to (7), wherein the writing circuit, when a format instruction is inputted from the control device, brings the storage element into the first resistance state.

(9)

The storage device according to (7), wherein the writing circuit, upon detecting activation of the control device, brings the storage element into the first resistance state.

(10)

The storage device according to (7), wherein the writing circuit, when information is read out from the storage element, brings the storage element into the first resistance state.

(11)

The storage device according to (7), including an internal timer, wherein the writing circuit, when a predetermined period of time is measured by the internal timer, brings the storage element into the first resistance state.

(12)

A semiconductor device including:

a storage device including a plurality of resistance change storage elements each of which stores information by using a difference of a resistance state; and a control device including an initial write instruction unit that, before accepting an information write request to the storage device, outputs to the storage device a write instruction to bring the storage element into a first resistance state, and a data write instruction unit that, upon accepting the write request, outputs to the storage device a write instruction to bring the storage element into the first resistance state or a second resistance state according to the write request.

(13)

The semiconductor device according to (12), wherein the storage device includes:

a first storage element that enters the first resistance state in response to a write instruction to bring an object into the first resistance state;

a second storage element that enters the second resistance state in response to a write instruction to bring an object into the first resistance state; and a logical-physical converter that, when the write instruction is inputted from the initial write instruction unit, brings the second storage element into the first resistance state.

(14)

A control method, by a control device, including:

before accepting an information write request to a storage device including a plurality of resistance change storage elements each of which stores information by using a difference of a resistance state, outputting to the storage device a write instruction to bring the storage element into a first resistance state; and upon accepting the write request, outputting to the storage device a write instruction to bring the storage element into the first resistance state or a second resistance state according to the write request.

REFERENCE SIGNS LIST

100, 101, 103, 104, 105, 106, 107, 108 SEMICONDUCTOR DEVICE

10, 10a, 10b, 10c CONTROL DEVICE
20, 20a, 20b, 20c STORAGE DEVICE
21 WRITING CIRCUIT
22 SELECTION CIRCUIT
23 MEMORY CELL ARRAY
30, 30a, 30b INITIAL WRITE INSTRUCTION UNIT
31, 31a WRITE INSTRUCTION GENERATION UNIT
31c INITIAL WRITE INSTRUCTION GENERATION UNIT
32 INITIAL ADDRESS GENERATION UNIT
33 INITIAL DATA GENERATION UNIT
40, 40a DATA WRITE INSTRUCTION UNIT
41 WRITE INSTRUCTION GENERATION UNIT
42 ADDRESS GENERATION UNIT
43 DATA GENERATION UNIT
44 PARITY GENERATION UNIT
45 READOUT INSTRUCTION GENERATION UNIT
51, 52, 53, 54 MULTIPLEXER
110 SEMICONDUCTOR CONTROL DEVICE
200 RESISTANCE CHANGE SEMICONDUCTOR STORAGE DEVICE
300 IMAGING DEVICE
111 SIGNAL PROCESSING CIRCUIT
400, 401 STORAGE SYSTEM
500 ELECTRONIC DEVICE
510 SYSTEM-IN-PACKAGE
512, 514, 516, 601, 608 STORAGE DEVICE
513 WIRELESS COMMUNICATION INTERFACE
515 AUDIO CIRCUIT
602 ANTENNA
603 SPEAKER
604 MICROPHONE
606 INPUT DEVICE
607 SENSOR
609 POWER SOURCE

The invention claimed is:

1. A control device comprising:

an initial write instruction unit that, before accepting an information write request to a storage device including a plurality of resistance change storage elements, including a first storage element and a second storage element, each of which stores information by using a difference of a resistance state, outputs to the storage device a first write instruction including an entire surface of a cell array to write information to all elements of the cell array to bring the first storage element and the second storage element into a first resistance state; and a data write instruction unit that, upon accepting the write request, outputs to the storage device a second write instruction to bring the first storage element and the second storage element into the first resistance state or a second resistance state, respectively, according to the write request, wherein the first storage element enters the first resistance state in response to the second write instruction corresponding to bringing a first object into the first resistance state, and the second storage element enters the second resistance state in response to the second write instruction corresponding to bringing a second object into the first resistance state.

2. The control device according to claim 1, wherein the initial write instruction unit outputs, to the storage device, the first write instruction including an address of the storage element designating the first storage element to be brought into the first resistance state and a command to bring the first storage element corresponding to the address into the first resistance state.

3. The control device according to claim 2, wherein the initial write instruction unit designates all the storage elements as the storage elements to be brought into the first resistance state.

4. The control device according to claim 1, wherein the data write instruction unit outputs, to the storage device, the second write instruction including an address of the first storage element designating the first storage element to be brought into the first resistance state, a command to bring the first storage element corresponding to the address into the first resistance state, and the second write instruction including the address of the second storage element designating the second storage element to be brought into the second resistance state, and a command to bring the second storage element corresponding to the address into the second resistance state.

5. The control device according to claim 1, wherein the data write instruction unit outputs, to the storage device, the second write instruction including an address of the first storage element designating the first storage element to be brought into the second resistance state and a command to bring the first storage element corresponding to the address into the second resistance state.

6. The control device according to claim 1, wherein the initial write instruction unit outputs, to the storage device, a first write instruction including a parity control signal whereby a parity storage element that stores parity to be inserted into information to be written on the storage device is brought into the first resistance state.

7. A storage device comprising:
a plurality of resistance change storage elements, including a first storage element and a second storage element, each of which stores information by using a difference of a resistance state; and
a writing circuit that, before an information write request is accepted by a control device, receives a first write instruction including an entire surface of a cell array to write information to all elements of the cell array to bring the first storage element and the second storage element into a first resistance state and brings the first storage element and the second storage element into a first resistance state, and when a second write instruction is inputted from the control device that has accepted the information write request, brings the first storage element and the second storage element into the first resistance state or a second resistance state, respectively, according to the write request, wherein
the first storage element enters the first resistance state in response to the second write instruction being to bring a first object into the first resistance state; and
the second storage element enters the second resistance state in response to the second write instruction being to bring a second object into the first resistance state.

8. The storage device according to claim 7, wherein the writing circuit, when a format instruction is inputted from the control device, brings the first storage element into the first resistance state.

9. The storage device according to claim 7, wherein the writing circuit, upon detecting activation of the control device, brings the first storage element into the first resistance state.

10. The storage device according to claim 7, wherein the writing circuit, when information is read out from the first storage element, brings the first storage element into the first resistance state.

11. The storage device according to claim 7, comprising an internal timer, wherein the writing circuit, when a predetermined period of time is measured by the internal timer, brings the first storage element into the first resistance state.

12. A semiconductor device comprising:
a storage device including a plurality of resistance change storage elements, including a first storage element and a second storage element, each of which stores information by using a difference of a resistance state; and
a control device including
an initial write instruction unit that, before accepting an information write request to the storage device, outputs to the storage device a first write instruction including an entire surface of a cell array to write information to all elements of the cell array to bring the first storage element and the second storage element into a first resistance state, and
a data write instruction unit that, upon accepting the write request, outputs to the storage device a second write instruction to bring the first storage element and the second storage element into the first resistance state or a second resistance state, respectively, according to the write request, wherein
the first storage element enters the first resistance state in response to the second write instruction corresponding to bringing a first object into the first resistance state, and
the second storage element enters the second resistance state in response to the second write instruction corresponding to bringing a second object into the first resistance state.

13. The semiconductor device according to claim 12, wherein
the storage device includes:
a logical-physical converter that, when the first write instruction is inputted from the initial write instruction unit, brings the second storage element into the first resistance state.

14. A control method, by a control device, comprising:
before accepting an information write request to a storage device including a plurality of resistance change storage elements, including a first storage element and a second storage element, each of which stores information by using a difference of a resistance state, outputting to the storage device a first write instruction including an entire surface of a cell array to write information to all elements of the cell array to bring the storage element into a first resistance state;
upon accepting the write request, outputting to the storage device a second write instruction to bring the first storage element and the second storage element into the first resistance state or a second resistance state, respectively, according to the write request;
in response to the second write instruction corresponding to bringing a first object into the first resistance state, the first storage element enters the first resistance state; and in response to the second write instruction corresponding to bringing a second object into the first resistance state, the second storage element enters the second resistance state.

\* \* \* \* \*